United States Patent [19]

Kellum et al.

[11] Patent Number: 5,629,947
[45] Date of Patent: May 13, 1997

[54] METHOD AND APPARATUS FOR DETECTING POSITIVE AND NEGATIVE RUNT PULSES SIMULTANEOUSLY

[75] Inventors: Reginald Kellum; B. Allen Montijo, both of Colorado Springs, Colo.

[73] Assignee: Hewlett-Packard Company, Palo Alto, Calif.

[21] Appl. No.: 585,057

[22] Filed: Jan. 11, 1996

[51] Int. Cl.⁶ .................................................. G06F 11/60
[52] U.S. Cl. .................................................. 371/28; 371/6
[58] Field of Search ..................... 371/28, 6; 324/73 R, 324/184; 365/201

[56] References Cited

U.S. PATENT DOCUMENTS

| | | |
|---|---|---|
| 3,976,940 | 8/1976 | Chau et al. . |
| 4,100,532 | 7/1978 | Farnbach . |
| 4,107,651 | 8/1978 | Martin . |
| 4,495,621 | 1/1985 | Nakagomi et al. . |
| 4,495,642 | 1/1985 | Zellmer . |
| 4,829,521 | 5/1989 | Southard . |
| 4,965,800 | 10/1990 | Farnbach . |

*Primary Examiner*—Vincent P. Canney

[57] ABSTRACT

The present invention comprises a runt fault detector which detects positive and negative runt faults based only upon the crossings of a high voltage threshold and a low voltage threshold. Specifically, the runt fault detector detects a positive runt fault when an input signal transitions from below to above the low voltage threshold and then back below the low voltage threshold without first transitioning from below to above the high voltage threshold. The runt fault detector also detects a negative runt fault when an input signal transitions from above to below the high voltage threshold and then back above the high voltage threshold without first transitioning from above to below the low voltage threshold. Simultaneous detection of both positive and negative runt faults may also be achieved by the present invention.

19 Claims, 11 Drawing Sheets

METHOD AND APPARATUS FOR DETECTING POSITIVE AND NEGATIVE RUNT PULSES SIMULTANEOUSLY

FIELD OF THE INVENTION

The present invention relates to electrical circuits generally, and to devices for monitoring the quality of digital signals. More particularly, the invention relates to a runt fault detector for simultaneously detecting positive and negative runt pulses present on a digital signal, which may indicate an error in circuit operation.

BACKGROUND OF THE INVENTION

With the expansive shift from analog to digital technology over the past couple of decades has come new problems in the art of debugging electronic circuits. One cause has been the way digital circuit components operate in recognizing digital signals. Digital signals are generally quantized into a number of levels. Each quantized level is recognizable by a given digital component and is delineated from contiguous levels by predetermined voltage threshold levels. The most commonly used digital environment is the binary digital system, where a digital signal is quantized into two levels—"zero" and "one". The "zero" and "one" levels are delineated from one another by a low voltage threshold and a high voltage threshold, such that a digital signal is recognized as a "zero" when it is below the low voltage threshold, and is recognized as a "one" when it is above the high voltage threshold. For any given digital component, a digital signal which is above the low voltage threshold but below the high voltage threshold is theoretically unrecognizable by the digital component. However, in practice, depending on how close the digital signal comes to approaching a recognizable voltage range, the digital component may actually recognize the digital signal as being in the quantized level corresponding to the closely approached voltage range (i.e., a signal very close to but not above the high voltage threshold may still be recognized as a "one", or a signal very close to but not below the low voltage threshold may still be recognized as a "zero").

A digital signal may pass out of the "zero" or "one" voltage range and back into the respective "zero" or "one" voltage range without ever passing into the respective opposite "one" or "zero" voltage range. This condition is called a "runt" pulse, which is often further characterized as a "negative runt" and a "positive runt". A negative runt occurs when a digital signal transitions from above to below a high voltage threshold and returns back above the high voltage threshold without first transitioning below a low voltage threshold. A positive runt occurs when a digital signal transitions from below to above a low voltage threshold and returns back below the low voltage threshold without first transitioning above a high voltage threshold. The occurrence of a runt pulse may be due to circuitry noise or perhaps even to improper circuit design. Since digital circuit components depend on a digital signal being in a given quantized level (i.e., in a binary system, a digital component may depend on the digital signal being either a "zero" or a "one"), the occurrence of a runt pulse on the digital signal may cause the digital component to detect a "false" signal which may thereby result in improper operation of the digital circuit. Thus, a runt fault appearing on a digital signal is a strong indication that the digital circuit may function improperly immediately or under slightly different conditions. The actual cause and exact nature of the fault may be unknown but it is often related to either the logic of the circuit design, or a problem with the electrical components comprising the digital circuit. It is for this reason that the detection of runt pulses on digital signals is important for debugging digital circuits. Thus, it is an object of the present invention to provide a method and apparatus for detecting the occurrence of positive and negative runt faults on a digital signal.

Many testing tools presently exist for analyzing the operation of digital circuits, including the logic probe, the logic analyzer and the digital oscilloscope.

The logic probe comprises digital circuitry that displays the state of the signal to which it is connected. Often, two LEDs are provided: one to indicate a high state, the other to indicate a low state. If neither is lighted, the signal is in the float state (i.e., above the low voltage threshold and below the high voltage threshold).

Some logic probes have an additional feature which allows them to "capture" pulses. Such a probe can be used to detect the existence of pulses where none should exist. However, logic probes cannot detect the existence of a bad pulse among a number of good pulses. For example, the commercially available Hewlett Packard Model 545A TTL/CMOS Logic Probe has an independent, built-in pulse memory with LED display. To utilize this feature, the memory must be reset, and the probe connected to the circuit point. A pulse will light the LED, which then remains on until reset. As another feature, the probe also indicates a return to an initial valid level from a bad level for a pulse width greater than or equal to 1 µsec.

Another type of digital measuring instrument is the logic analyzer, which is connected to the test circuit by a number of probes or "grabber connections" each of which acts as a simple connection without the more advanced features of the Hewlett Packard Logic Probe described above. In their connection with a logic analyzer, these probes are often grouped together in groups of eight, termed a "Probe Pod." An example of such a probe pod is the commercially available Biomation Model K100-D/10 Probe Pod. In that model, eight grabber connections are provided for connection to the circuit, and the high and low thresholds are selectable by the user. One or more pods may be connected to the logic analyzer to monitor the necessary number of connections.

In general terms, a logic analyzer is used to record and display the sequence of signal states appearing at each grabber connection of the probe pod. An internal clock is provided, so that the state of each connection is recorded with each clock pulse. The rate of the clock is generally selectable by the user, up to a maximum of about 100 MHz. At 100 MHz, it requires 1 MB of memory to store eight channels of data for 10 ms. An operator, analyzing this data, may spend several hours analyzing the data captured in 10 ms.

Problems inherent in the use of the logic analyzer include the high cost of the equipment, the specialized knowledge necessary to operate a logic analyzer effectively, and the huge amounts of information collected by the logic analyzer which must be reviewed to find a hidden error.

Another type of instrument used to test digital circuits is the oscilloscope, which draws a trace of the signal under test on an oscilloscope screen or CRT. Since each trace only lasts about a microsecond, the eye sees the accumulation of several hundred thousand traces; a single bad trace is usually missed altogether.

A disadvantage, common to both oscilloscopes and logic analyzers, is that both gather data only intermittently, hence they may miss an infrequent problem. For example, both oscilloscopes and logic analyzers miss information that occurs between traces or sampling times.

Another digital circuit testing device is disclosed in Farnbach, U.S. Pat. No. 4,965,800, in which a test circuit can simultaneously detect one or all of three faults in a digital circuit, including: (1) a voltage spike which occurs when the signal briefly jumps either high or low; (2) a float fault which occurs when the signal is floating for too long; and (3) a noise fault which occurs when the signal passes from either the high or the low state to the float state, and then returns directly to the same state. In the Farnbach test circuit, the signal to be tested is first processed in an input state discriminator to classify it by state, either high, low, or float. The Farnbach noise fault detector is an asymmetrical series of AND/OR gates which specifically depends on the prior and present state (high, low or float) of the input signal.

It would be desirable to provide an inexpensive and efficient runt pulse detector which uses a minimum number of circuit components which maximizes the potential bandwidth. It would also be desirable to provide a runt pulse detector which continuously monitors a digital signal and provides for the simultaneous detection of positive and negative runt pulses present on the digital signal based only upon high and low voltage threshold crossings.

SUMMARY OF THE INVENTION

The present invention comprises a runt fault detector for monitoring a digital signal and for detecting the presence of positive and/or negative runt pulses on the digital signal. For the purposes of the present invention, a "positive runt fault" occurs when a digital signal transitions from below to above a low voltage threshold and then transitions back below the low voltage threshold before first transitioning above a high voltage threshold. A "negative runt fault" occurs when a digital signal transitions from above to below a high voltage threshold and then transitions back above the high voltage threshold before first transitioning below a low voltage threshold.

The runt fault detector comprises a threshold comparator which simultaneously compares an input signal with a low voltage threshold and a high voltage threshold and which produces a Negative Transition signal which indicates a transition by the input signal from above to below the low voltage threshold, and which also produces a Positive Transition signal which indicates a transition by the input signal from below to above the high voltage threshold.

The present invention further comprises a full transition detector which, based upon the threshold transitions produced by the threshold comparator, produces a Full_High_ Transition signal when the input signal makes a full transition from below the low voltage threshold to above the high voltage threshold, or, during the initial startup of the runt fault detector, when the input signal is either initially above the high threshold or initially floating and then transitions above the high threshold. The full transition detector also produces a Full_Low_Transition signal when the input signal makes a full transition from above the high voltage threshold to below the low voltage threshold, or, during the initial startup of the runt fault detector, when the input signal is either initially below the low threshold or initially floating and then transitions below the low threshold.

Finally, the present invention comprises a runt detection unit which monitors the Full_Low_Transition signal and the Negative Transition signal to generate a runt fault upon the occurrence, in sequence, of the Full_Low_Transition signal and then the Negative Transition signal without an intervening Positive Transition signal, and which also monitors the Full_High_Transition signal and the Positive Transition signal to generate a runt fault upon the occurrence, in sequence, of the Full_High_Transition signal and then the Positive Transition signal without an intervening Negative Transition signal.

In one preferred embodiment, the threshold comparator is implemented with a pair of comparators, which generates the threshold crossing signals. A first comparator is connected to receive a low threshold and an input signal, generating a Negative Transition signal when the input signal crosses below the low threshold. A second comparator is connected to receive a high threshold and the input signal, generating a Positive Transition signal when the input signal crosses above the high threshold. The full transition detector is implemented with an S-R flip-flop, connected to receive the threshold crossing signals from the pair of comparators. The full transition detector produces a Full_Low_ Transition signal and a Full_High_Transition signal at its output. At the initial startup of the runt fault detector, the Full_Low_Transition signal becomes valid (high) when the input signal is initially below the low threshold voltage or is initially floating and then transitions below the low threshold. At the initial startup of the runt fault detector, the Full_High_Transition signal becomes valid (high) when the input signal is initially above the high threshold or is initially floating and then transitions above the high threshold. After the initial startup of the runt fault detector, the Full_Low Transition signal only becomes valid when the full transition detector detects a full high-to-low transition by the input signal from above the high voltage threshold to below the low voltage threshold, and will subsequently become invalid only upon detection of a subsequent low-to-high transition by the input signal from below the low voltage threshold to above the high voltage threshold. Similarly, after the initial startup of the runt fault detector, the Full_High_Transition signal only becomes valid when the full transition detector detects a full low-to-high transition by the input signal from below the low voltage threshold to above the high voltage threshold, and will subsequently become invalid only upon detection of a subsequent high-to-low transition by the input signal from above the high voltage threshold to below the low voltage threshold. The Full_Low_Transition signal and a Full_High_Transition signal are input to the respective data inputs of a pair of D-type flip-flops, which are clocked by the Negative Transition and Positive Transition signals from the threshold comparators in order to detect positive and negative runt faults, respectively.

The above implementations each provide a simple efficient solution to simultaneously detecting positive and negative runt pulses on a digital signal based only upon threshold crossings by the digital signal.

These and other advantages and features of the present invention will become more fully apparent from the following description and appended claims taken in conjunction with the accompanying drawings.

BRIEF DESCRIPTION OF THE DRAWING

An illustrative and presently preferred embodiment of the invention is shown in the accompanying drawings in which.

DETAILED DESCRIPTION OF THE INVENTION

In general, FIGS. 4-13 detail a runt fault detector in accordance with the present invention. The runt fault detector includes a Threshold Comparator which is responsive to an input signal and a first and second voltage threshold. The Threshold Comparator produces a first transition signal when the digital input signal transitions across the first voltage threshold in a first direction away from the second voltage threshold, and produces a second transition signal when the digital input signal transitions across the second voltage threshold in a second direction opposite the first direction.

The runt fault detector also comprises a Full Transition Detector responsive to the first and second transition signals. The Full Transition Detector produces a first full-transition signal either (1) when the input signal is initially already across the first voltage threshold in the first direction, (2) when the input signal is initially floating and then transitions across the first voltage threshold in the first direction, or (3) upon detection in sequence of a full transition by the input signal across the second voltage threshold and then the first voltage threshold in the first direction. The Full Transition Detector may also produce a second full-transition signal either (1) when the input signal is initially already across the second voltage threshold in the second direction, (2) when the input signal is initially floating and then transitions across the second voltage threshold in the second direction, or (3) upon detection in sequence of a full transition by the input signal across the first voltage threshold and then the second voltage threshold in the second direction.

The runt fault detector also comprises a Runt Detector responsive to the first full-transition signal and the first transition signal to generate a runt fault signal upon detection in sequence of the first full-transition signal and then the first transition signal without an intervening detection of the second transition signal. The Runt Detector may also be responsive to the second full-transition signal and the second transition signal to also generate a runt fault signal upon detection in sequence of the second full-transition signal and then the second transition signal without an intervening detection of the first transition signal.

Having thus described a fault detector in general, various specific features of the fault detector and its method of operation will now be described in detail.

For purposes of this discussion, an input signal may assume any of an infinite variety of waveforms, and therefore the specific examples chosen for an input signal are exemplary. The characteristics of the detected positive and negative runt pulses are best understood in light of the following discussion.

Figure 1:
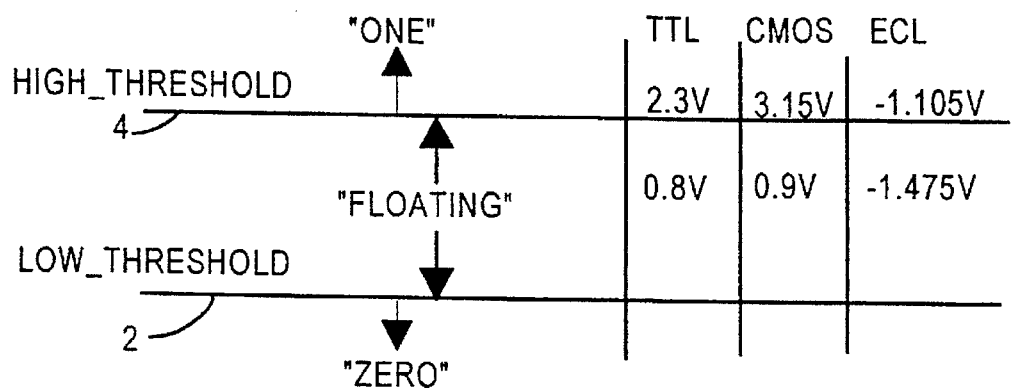
FIG. 1 is a graphical illustration of the relationship in a digital circuit between the high voltage threshold, the low voltage threshold, and voltage levels recognized by the digital circuit with respect to these voltages.

In a digital system, a digital signal may assume any one of a defined number of levels, dependent only upon the degree of signal quantization used by the system. For example, in a binary system, a digital signal represents a "zero" or a "one". With reference to FIG. 1, a binary digital signal is detected as a "zero" or "one" when it comes within a defined voltage range which is delineated by defined voltage thresholds. Thus, as shown in FIG. 1, a "zero" is detected and said to be in the low state whenever the binary digital signal is below a low threshold defined by Low_Threshold 2. A "one" is likewise detected and said to be in the high state whenever the signal is above a high threshold defined by High_Threshold 4. Using this simple voltage range recognition technique, digital circuit components easily classify an input signal as a "zero" or "one" when the signal is within either the range below the low voltage threshold or the range above the high state voltage. However, when the input signal is transitioning from one state to the other (i.e., when the input signal is above the low threshold Low_Threshold 2 but below the high threshold High_Threshold 4), the signal is said to be "floating" and the level of the signal recognized by the digital circuit component is indeterminant. In a binary digital system, the specific voltage levels corresponding to the high threshold High_Threshold 4 and the low threshold Low_Threshold 2 may both vary depending upon the family of components used or upon the specific application. For example, in transistor-transistor logic (TTL), a commonly used component family, the high voltage threshold may be +2.0 volts and the low voltage threshold may be +0.8 volts. Likewise, in CMOS components, the high voltage threshold may be 3.15 volts and the low voltage threshold may be 0.9 volts. For ECL components, the high voltage threshold may be −1.105 volts and the low voltage threshold may be −1.475 volts.

The following discussion focuses on the operation of the present invention in a binary system. However, it is to be understood that the present invention is not meant to be limited to operation in a binary system and may be extended to a digital system based on any number of different quantization levels, where each level is associated with a defined voltage range delineated by defined voltage thresholds.

Figure 2:
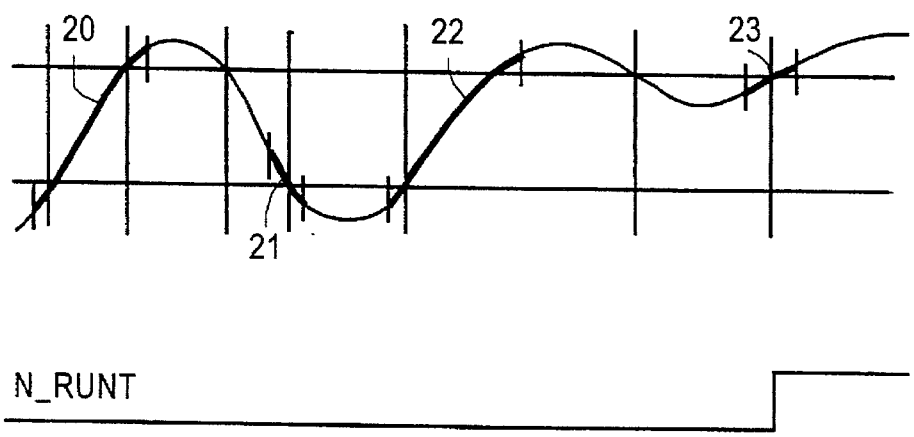
FIG. 2 is a timing diagram of a representative digital signal exhibiting the characteristics of both a valid signal-transitioning and an invalid signal-transitioning which results in a negative runt fault.

As used in the description of the present invention, a "negative runt" pulse occurs whenever an input signal crosses from above to below the high threshold 4 and returns above the high threshold 4 without ever crossing below the low threshold 2. FIG. 2 shows an example input signal which illustrates valid signal transitioning on segments 20, 21 and 22, followed by a negative runt pulse detected at segment 23. As shown in FIG. 2, a Full_High_Transition transition by the input signal from below the low threshold to above the high threshold occurs on segment 20. A subsequent transition by the input signal from above the high threshold to below the low threshold on segment 21 indicates a valid signal transition, and thus no runt fault is detected. A full-low-to-high transition by the input signal occurs again on segment 22. A subsequent transition by the input signal back above the high threshold without first transitioning below the low threshold, which occurs on segment 23, indicates an invalid signal transition, thereby triggering the detection of a runt fault, as shown by the N_RUNT signal.

Figure 3:
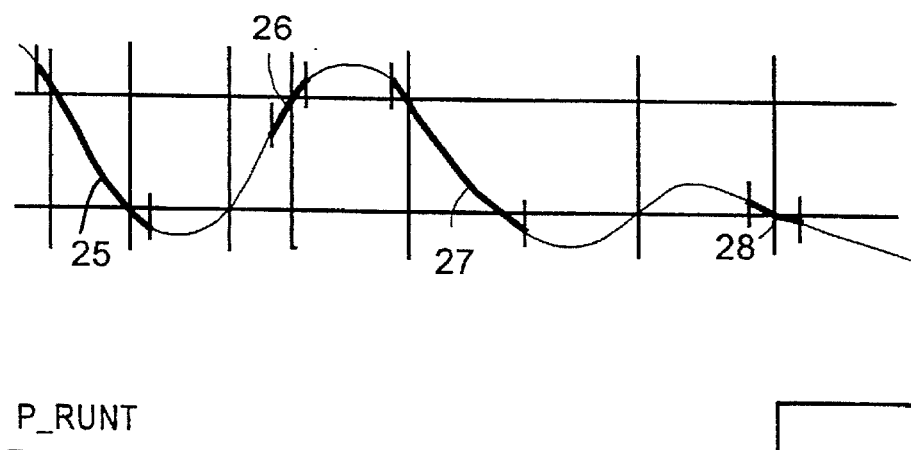
FIG. 3 is a timing diagram of a representative digital signal exhibiting the characteristics of both a valid signal transitioning and an invalid signal-transitioning which results in a positive runt fault.

Similarly, a "positive runt" pulse occurs whenever an input signal crosses from below to above the low threshold 2 and returns below the low threshold 2 without ever crossing above the high threshold 4. FIG. 3 shows an example input signal which illustrates valid signal transitioning on segments 25, 26 and 27, followed by a negative runt pulse detected at segment 28. Thus, as shown in FIG. 3, a full-high-to-low transition by the input signal from above the high threshold to below the low threshold occurs on segment 25. A subsequent transition by the input signal from below the low threshold to above the high threshold on segment 26 indicates a valid signal transition, and thus no runt fault is detected. A full-high-to-low transition by the input signal occurs again on segment 27. A subsequent transition by the input signal back below the low threshold without first transitioning above the high threshold, which occurs on segment 28, indicates an invalid signal transition, thereby triggering the detection of a runt fault, as shown by the P_RUNT signal.

It will be appreciated that the input signal waveform shown in FIGS. 2 and 3 are by way of example only, and that the input waveform may assume an infinite variety of possible waveforms. It will also be appreciated that the input signal may be initially below the low threshold, floating, or above the high threshold.

As earlier stated, when a signal is floating (i.e., it is above a low voltage threshold 2 but below a high voltage threshold 4), the recognized state of the floating signal by any given digital component is indeterminant. Thus, a runt pulse may appear as a legitimate pulse to some digital circuit components, thereby potentially generating an error in the circuit. It is for this reason that detection of runt pulses becomes very important.

Figure 4:
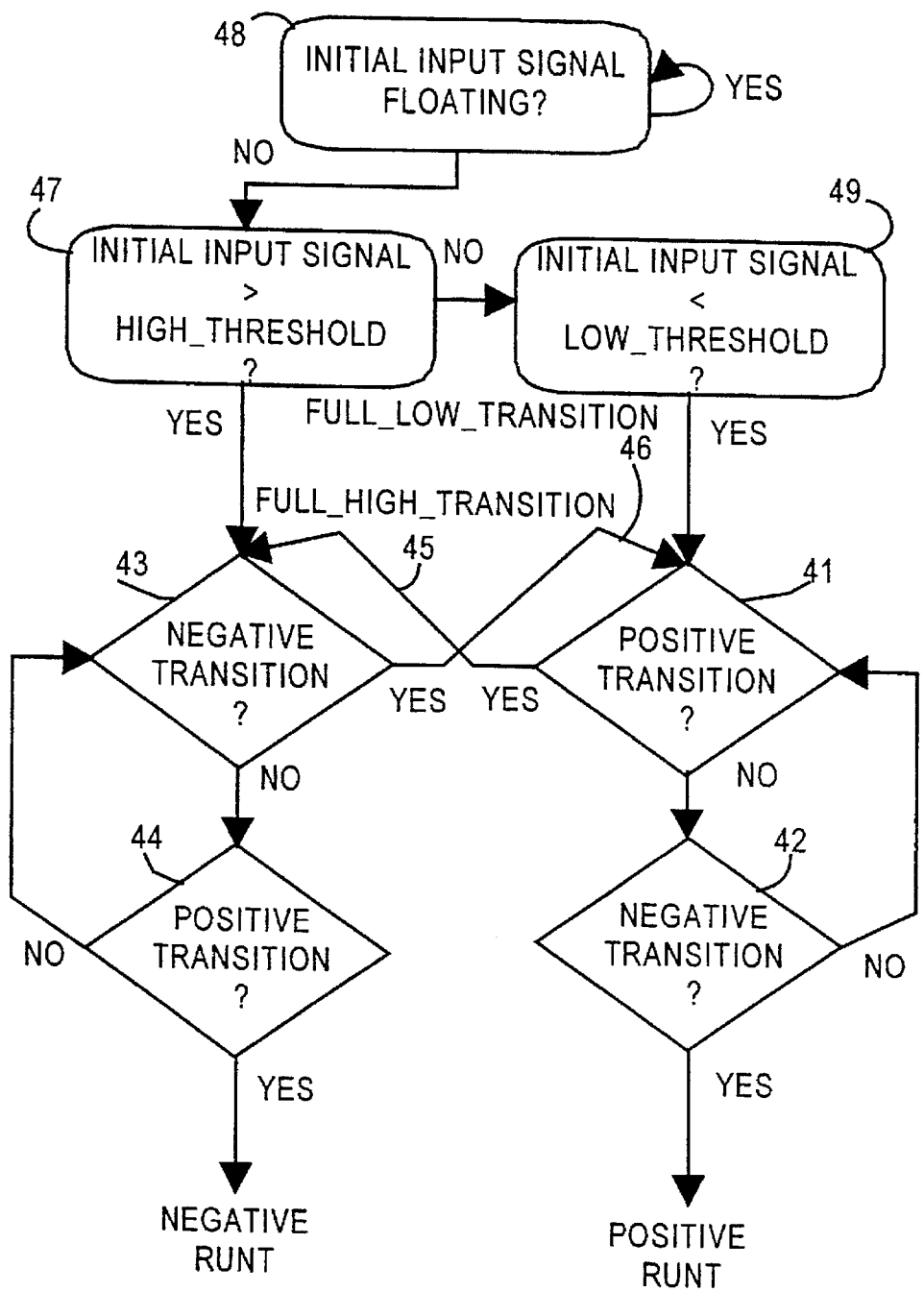
FIG. 4 is a flowchart illustrating the operation of a preferred embodiment of the runt fault detector of the present invention.

FIG. 4 shows a flowchart of the operation of the runt fault detector of the present invention. As shown in FIG. 4, a Negative Transition is defined by a transition by the input signal from above to below Low_Threshold 2, and a Positive Transition is defined by a transition by the input signal from below to above High_Threshold 4.

For the purposes of this discussion, it will be assumed that the input signal matches the initial condition in block 49, and is initially below the low voltage threshold Low_Threshold 2. Thus, with the input signal initially below Low_Threshold 2, the runt fault detector begins by looking for a "positive" runt fault. The input signal is monitored, either alternately as shown in FIG. 4 or simultaneously, for a Positive Transition in detection block 41 and for a Negative Transition in detection block 42. Thus, as shown in FIG. 4, if a Positive Transition is not detected in detection block 41, control passes to detection block 42 to monitor the input signal for a Negative Transition. If a Negative Transition is not detected in detection block 42, control passes back to detection block 41 to monitor the input signal for a Positive Transition. Control alternates back and forth between detection blocks 41 and 42 until either a Positive Transition or a Negative Transition occurs. In the preferred embodiment, detection blocks 41 and 42 simultaneously monitor the input signal, eliminating the need for control switching.

If a Negative Transition is detected by detection block 42, a positive runt signal is generated, indicating that the input signal transitioned from below-to-above Low_Threshold 2 and returned to below Low_Threshold 2 without first transitioning above High_Threshold 4, as shown in FIG. 3 at segment 28. If, however, a Positive Transition is detected by detection block 41, a full-low-to-high transition by the input signal from below Low_Threshold 2 to above High_Threshold 4 has occurred, as shown in FIG. 2 at segments 20 and 22, which generates a Full_High_Transition signal 45. Control then shifts to detection blocks 43 and 44, where the runt fault detector begins looking for a "negative" runt fault.

When the runt fault detector is looking for a "negative" runt fault, the input signal is monitored, either alternately as shown in FIG. 4 or simultaneously, for a Negative Transition in detection block 43 and for a Positive Transition in detection block 44. Thus, as shown in FIG. 4, if a Negative Transition is not detected in detection block 43, control passes to detection block 44 to monitor the input signal for a Positive Transition. If a Positive Transition is not detected, control passes to detection block 43 to monitor the input signal for a Negative Transition. Control alternates back and forth between detection blocks 43 and 44 until either a Negative Transition or a Positive Transition occurs. In the preferred embodiment, detection blocks 43 and 44 simultaneously monitor the input signal, eliminating the need for control switching.

If a Positive Transition is detected by detection block 44, a negative runt signal is generated, indicating that the input signal transitioned from above-to-below High_Threshold 4 and returned to above High_Threshold 4 without first transitioning below Low_Threshold 2, as shown in FIG. 2 at segment 23. The portion of the flow diagram for detecting a runt fault caused by the condition in FIG. 4 at segment 23 is represented by detection block 44. If, however, a Negative Transition is detected by detection block 43, a full-high-to-low transition from above High_Threshold 4 to below Low_Threshold 2 by the input signal has occurred, as shown in FIG. 3 at segments 25 and 27, which generates a Full_Low_Transition signal 46. Control then shifts back to detection blocks 41 and 42, where the runt fault detector begins looking anew for a "positive" runt fault.

Control shifts back and forth between the positive runt fault detection blocks 41 and 42 and the negative runt fault detection blocks 43 and 44, continuously signaling runt faults as they are detected. As also shown in FIG. 4, the initial condition of the input signal may be below Low_Threshold 2 (as shown in block 49), above High_Threshold 4 (as shown in block 47), or floating between Low_Threshold 2 and High Threshold 4 (as shown in block 48). When the signal is floating, the input signal is continuously monitored until a transition above High_Threshold 4 or below Low_Threshold 2 is detected. Flow of operation then continues as described above.

Figure 5:
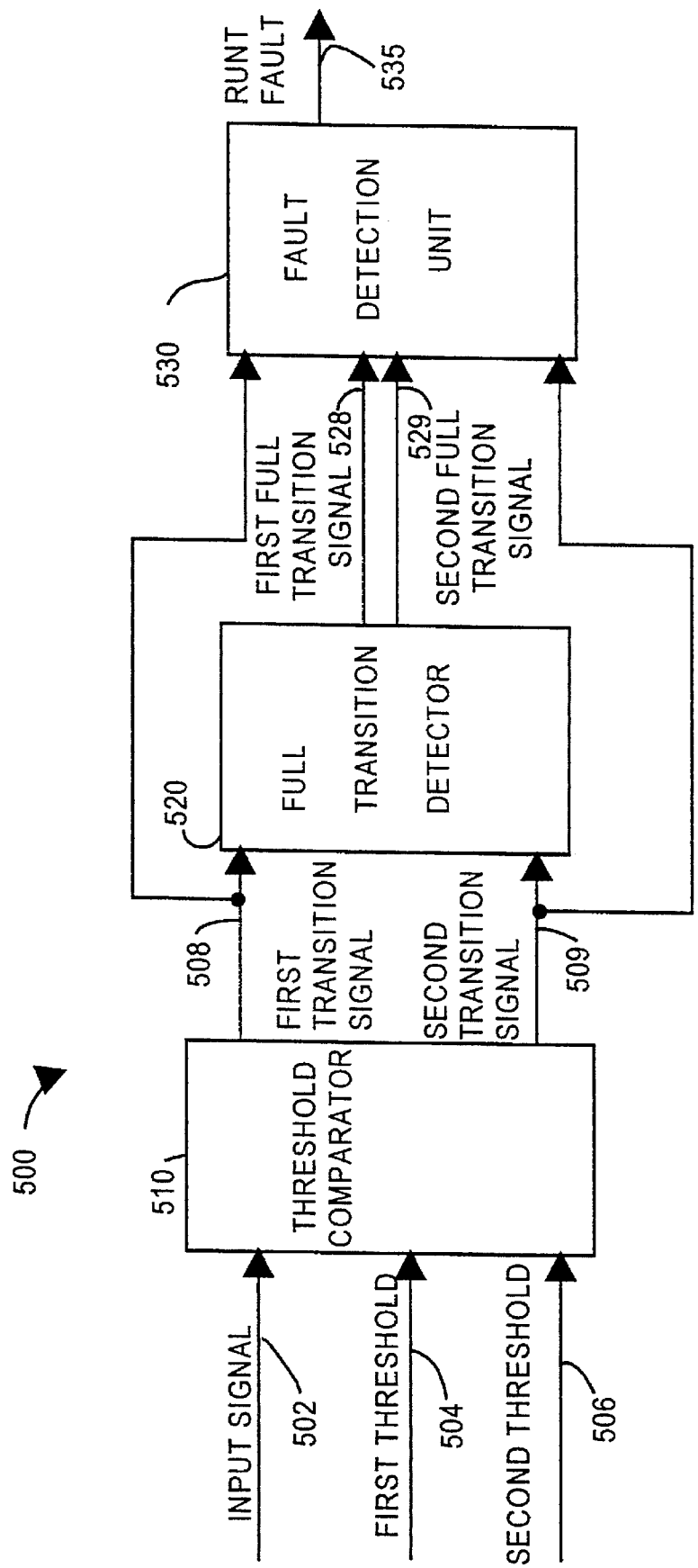
FIG. 5 is a block diagram of a runt fault detector in accordance with the present invention.

FIG. 5 shows a block diagram of a runt fault detector 500, in accordance with the present invention. As shown in FIG.

5, the runt fault detector 500 comprises a threshold comparator 510 which is responsive to an input signal 502, a first voltage threshold 504 and a second voltage threshold 506. The threshold comparator 510 produces a first transition signal 508 when the input signal 502 transitions across the first voltage threshold 504 in a first direction away from the second voltage threshold 506, and produces a second transition signal 509 when the input signal 502 transitions across the second voltage threshold 506 in a second direction opposite the first direction.

The fault detector 500 also comprises a full transition detector 520 responsive to the first transition signal 508 and the second transition signal 509. The full transition detector produces at least a first full-transition signal 528 upon detection of a full transition by the input signal 502 across the second voltage threshold 506 and then the first voltage threshold 504 in sequence in the first direction. It may also produce a second full-transition signal 529 upon detection of a full transition by the input signal 502 across the first voltage threshold 504 and the second voltage threshold 506 in sequence in the second direction.

The fault detector 500 also comprises a fault detection unit 530 responsive to the first full-transition signal 528 and the first transition signal 508 to generate a runt fault 535 upon detection in sequence of the first full-transition signal 528 and then the first transition signal 508 without an intervening detection of the second transition signal 509. The fault detection unit 530 is also responsive to the second full-transition signal 529 and the second transition signal 509 to generate a runt fault 535 upon detection in sequence of the second full-transition signal 529 and then the second transition signal 509 without an intervening detection of the first transition signal 508.

Figure 6:
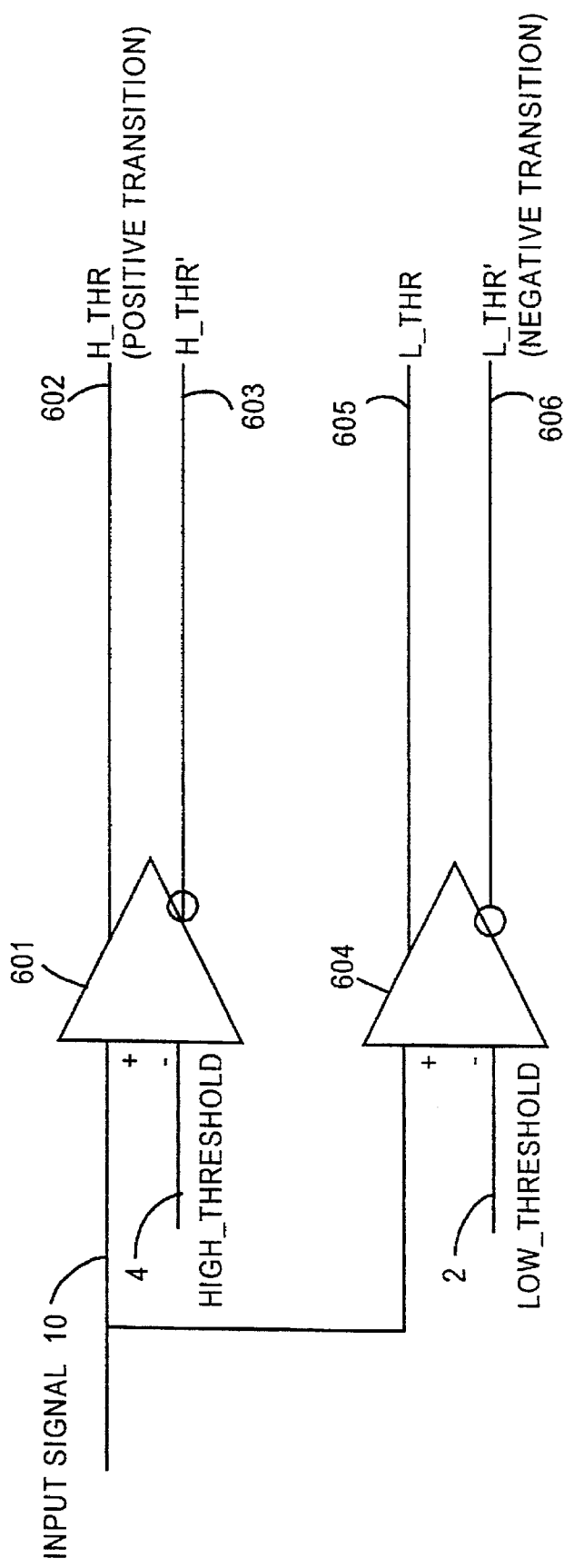
FIG. 6 is a schematic diagram of a threshold discriminator for detecting threshold crossings in accordance with the present invention.

FIG. 6 depicts a schematic diagram of one preferred embodiment of the threshold comparator 510 of FIG. 5. The preferred embodiment of the threshold comparator shown in FIG. 6 is generally designated at 600. As shown in FIG. 6, an input signal 10 is provided as an input to both a high threshold comparator 601 and a low threshold comparator 604. Also, a high voltage threshold High_Threshold 4 is provided as input to the high threshold comparator 601 and a low voltage threshold Low_Threshold 2 is provided to the low threshold comparator 604, such that the input signal 10 is simultaneously compared with High_Threshold 4 by high threshold comparator 601 and with Low_Threshold 2 by low threshold comparator 604. The high threshold comparator 601 provides a non-inverted output H_thr 602 which is in a low quantized level when the input signal 10 is below the high voltage threshold High_Threshold 4 and which is in a high quantized level when the input signal 10 is above High_Threshold 4. The high threshold comparator 601 also provides an inverted output H_thr' 603 which is always the complement of the signal H_thr 602. Similarly, the low threshold comparator 604 provides a non-inverted output L_thr 605 which is in a low quantized level when the input signal 10 is below the low voltage threshold Low_Threshold 2 and which is in a high quantized level when the input signal 10 is above Low_Threshold 2. The low threshold comparator 604 also provides an inverted output L_thr' 606 which is always the complement of the signal L_thr 605.

It will be appreciated that threshold comparator output signals H_thr 602 and L_thr' 606 may be monitored to detect a Positive Transition and a Negative Transition, respectively, as defined above with respect to the flowchart in FIG. 4, and generally corresponding to the signal conditions illustrated by segments 23 and 26, and 21 and 28 in FIGS. 2 and 3. The Positive Transition detection blocks 41 and 44 and the Negative Transition detection blocks 42 and 43 from FIG. 4 are thus implemented in the preferred embodiment by the high threshold and low threshold comparators 601 and 604 of the Threshold Comparator of FIG. 6. Thus detection of a negative transition from above to below the Low_Threshold 2 by the input signal is indicated by a rising edge on the L_thr' signal 606, which shall hereinafter be referred to as Negative Transition signal 606. Likewise, detection of a positive transition from below to above the High_Threshold 4 by the input signal is indicated by a rising edge on the H_thr signal 602, which shall hereinafter be referred to as Positive Transition signal 602.

a. A First Embodiment

Figure 7:
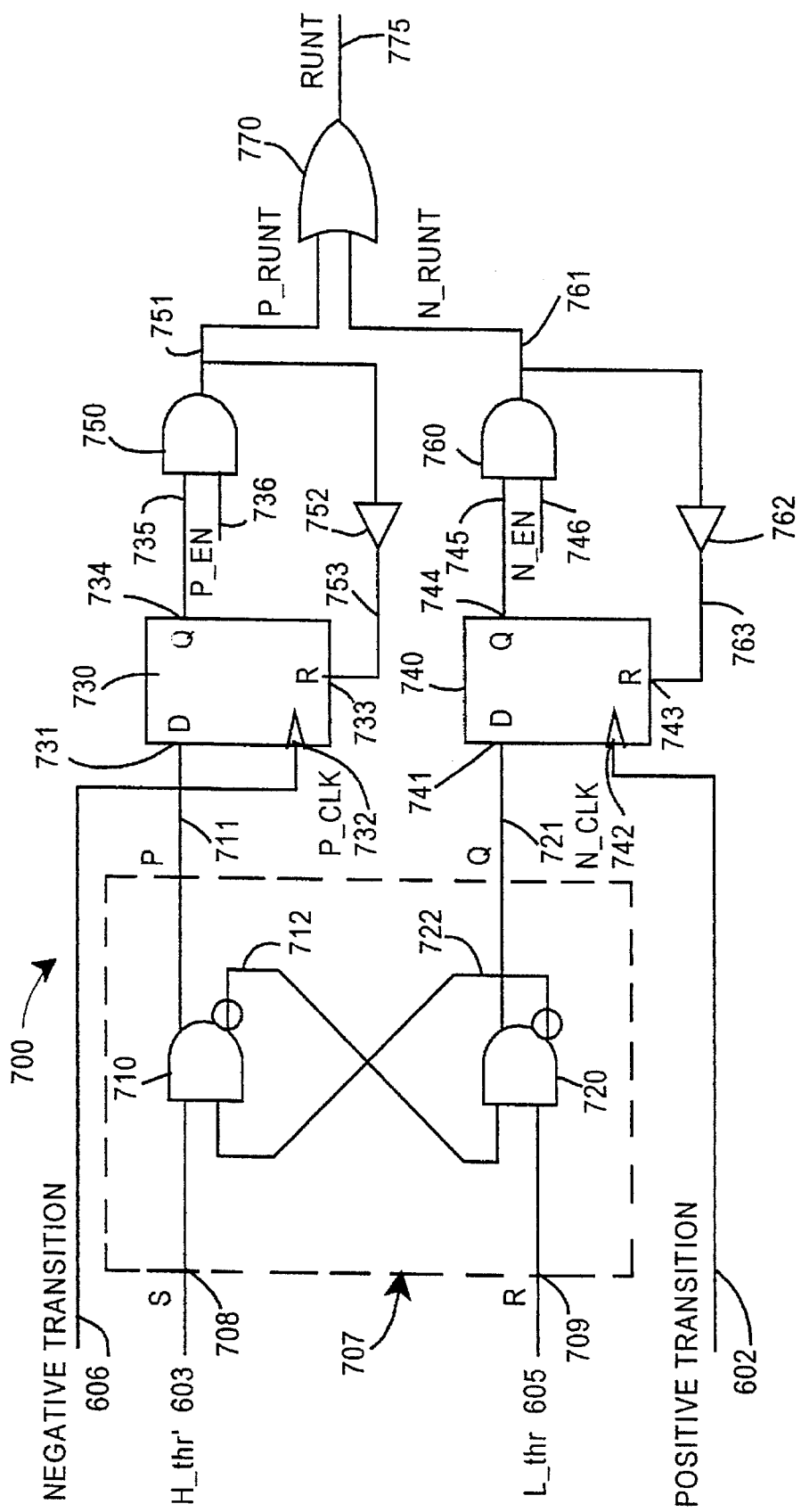
FIG. 7 is a schematic diagram illustrating a preferred embodiment of the runt fault detector of the present invention.

FIG. 7 depicts a schematic diagram of one preferred embodiment of the Full Transition Detector 520 and Runt Fault Detector 530 of FIG. 5. As shown in FIG. 7, the threshold comparator output signals H_thr' 603 and L_thr 605 from FIG. 6 are provided to an S-R ("set-reset") flip-flop 707 having an S ("set") input 708, an R ("reset") input 709, and which produces two output signals P 711 and Q 721. In the preferred embodiment shown in FIG. 7, the S-R flip-flop 707 is implemented with a pair of AND/NAND gates 710 and 720. This implementation causes the S-R flip-flop 707 to operate such that a low input signal on S input 708 sets the output signal P 711 low, and a low input signal on R input 709 resets the output signal P 711 to high. The input signals at S input 708 and R input 709 cause the output signals P 711 and Q 721 to never both be in the same state at the same time except during propagation delay intervals when the output signals P 711 and Q 721 are transitioning.

As seen in FIG. 7, a first AND/NAND gate 710 receives as input the inverted high threshold comparator output signal H_thr' 603 and an inverted second AND/NAND gate output 722 of a second AND/NAND gate 720. Similarly, second AND/NAND gate 720 receives as input the non-inverted low threshold comparator output signal L_thr 605 and an inverted first AND/NAND gate output 712 from first AND/NAND gate 710. The non-inverted outputs of first and second AND/NAND gates 710 and 720 correspond directly to the outputs P 711 and Q 721 of the S-R flip-flop 707.

Figure 8:
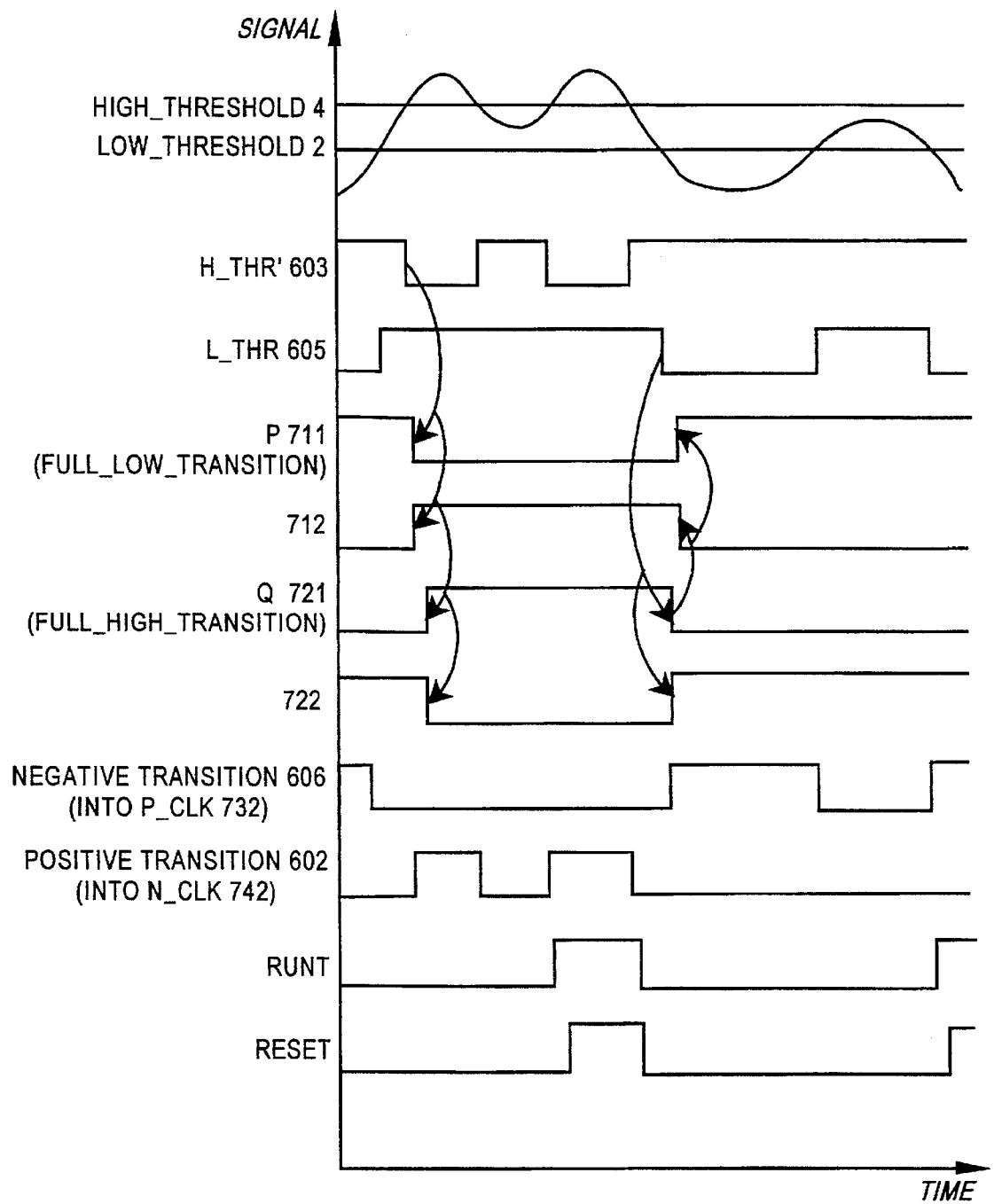
FIG. 8 is a timing diagram illustrating the operation of the preferred embodiment of the runt fault detector shown in FIG. 7.

The operation of the S-R flip-flop 707 is best understood in conjunction with the timing diagram in FIG. 8, which shows the operation of the signals of the runt fault detector of FIG. 7, given a representative input signal. As seen in FIG. 8, first AND/NAND gate 710 produces an output signal P 711 which is asserted high whenever the input signal 10 either (1) is initially below the low voltage threshold Low_Threshold 2, (2) is initially floating and then transitions below Low_Threshold 2, or (3) when the input signal makes a full transition from above the high voltage threshold High_Threshold 4 to below Low_Threshold 2. Output signal P 711 does not become deasserted low until the input signal 10 makes a full transition from below Low_Threshold 2 to above High_Threshold 4. According to this description, it is clear that once the initial condition of the input signal establishes the initial output value of S-R flip-flop output signal P 711, signal P 711 may be conveniently used to signal the detection of a full high-to-low transition, corresponding to the signal Full_Low_Transition 46 as defined in the flowchart in FIG. 4. It will be appreciated that if the input signal 10 is initially below Low_Threshold 2 or is initially floating and then transitions below Low_Threshold 2, the Full_Low_Transition signal 46 is also initially asserted.

Similarly, second AND/NAND gate 720 produces an output signal Q 721 which is asserted high whenever the input signal either (1) is initially above the high voltage threshold High_Threshold 4, (2) is initially floating and then transitions above High_Threshold 4, or (3) the input signal makes a full transition from below Low_Threshold 2 to above High_Threshold 4. Output signal Q 721 does not deassert low until the input signal 10 fully transitions from above High_Threshold 4 to below Low_Threshold 2. According to this description, it is clear that once the initial condition of the input signal establishes the initial output value of S-R flip-flop output signal Q 721, signal Q 721 may be conveniently used to signal the detection of a full low-to-high transition, corresponding to the signal Full_High_Transition 45 as defined in the flowchart in FIG. 4. It will be appreciated that if the input signal 10 is initially above High_Threshold 4 or is initially floating and then transitions above High_Threshold 4, the Full_High_Transition signal 45 is also initially asserted.

The output signals P 711 and Q 721 of the S-R flip-flop 707 corresponding to signals Full_Low_Transition 46 and Full_High_Transition 45 are provided to the respective data inputs 731 and 741 of a positive runt flip-flop 730 and a negative runt flip-flop 740. In the preferred embodiment, the positive runt flip-flop 730 and negative runt flip-flop 740 are implemented with a pair of positive edge triggered D-type flip-flops. Thus, the data input 731 of the positive runt flip-flop 730 receives the output signal P 711 from the S-R flip-flop 707 and the data input 741 of the negative runt flip-flop 740 receives the output signal Q 721.

The positive runt flip-flop 730 is used to detect a positive runt fault, where a transition is made by the input signal 10 from below Low_Threshold 2 to above Low_Threshold 2, and then back below Low_Threshold 2 without first transitioning above High_Threshold 4. The positive runt flip-flop 730 is driven by output signal P 711 from the S-R flip-flop 707. Thus, the data input 731 of positive runt flip-flop 730 always has the value of output signal P 711, which will be asserted high whenever the input signal 10 has fully transitioned from above High_Threshold 4 to below Low_Threshold 2, and which corresponds to the signal Full_Low_Transition 46 in the flowchart in FIG. 4. At this point, as indicated by detection blocks 41 and 42 in FIG. 4, the runt fault detector monitors the input signal 10 for either a Positive Transition by the input signal 10 from below to above High_Threshold 4 or a Negative Transition by the input signal 10 from above to below Low_Threshold 2.

The positive runt flip-flop 730 also has a clock input P_CLK 732. A rising edge seen at the clock input P_CLK 732 causes the positive runt flip-flop 730 to hold at positive runt output 734 the value of the data input signal P 711 at the time the rising edge occurs.

It is desired to detect a positive runt only after the occurrence in sequence of: (1) detection of a valid Full_Low_Transition signal (indicated by signal P 711), and then (2) detection of a subsequent Negative Transition (indicated by Negative Transition signal 606) without an intervening Positive Transition (indicated by Positive Transition signal 602). Thus, the Negative Transition signal 606 from the Threshold Comparator is used to drive the P_CLK input 732 of the positive runt flip-flop 630. Whenever the input signal transitions from above to below Low_Threshold 2, a rising edge occurs on the P_CLK input 732.

The negative runt flip-flop 740 also has a clock input N_CLK 742. A rising edge seen at the clock input N_CLK 742 causes the negative runt flip-flop 740 to hold at negative runt output 744 the value of the data input signal Q 721 at the time the rising edge occurs.

It is desired to detect a negative runt only after the occurrence in sequence of: (1) detection of a Full_High_Transition signal (indicated by signal Q 721), and then (2) detection of a subsequent Positive Transition by the input signal (indicated by Positive Transition signal 602) without an intervening Negative Transition (indicated by Negative Transition signal 606). Thus, the Positive Transition signal 602 from the Threshold Comparator is used to drive the N_CLK input 742 of the negative runt flip-flop 740. Whenever the input signal transitions from below to above High_Threshold 4, a rising edge occurs on the N_CLK input 742.

1. Detection of Negative Runts

In more detail, and with reference to the timing diagram in FIG. 8, the operation for detecting a negative runt fault, with reference to FIG. 7, is as follows. Before the input signal 10 crosses above High_Threshold 4, the data input signal Q 721 of negative runt flip-flop 740, corresponding to the signal Full_High_Transition 45 in FIG. 4, will be low. A full transition from below Low_Threshold 2 to above High_Threshold 4 by the input signal 10 causes a rising edge on clock input N_CLK 742 when the data input signal Q 711 for negative runt flip-flop 740 is still deasserted low. This causes the negative runt flip-flop 740 to hold the Negative_Runt signal 745 low at negative runt flip-flop output 744. The full low-to-high transition by the input signal 10 also causes output signal P 711 to deassert low and output signal Q 711, corresponding to the signal Full_High_Transition 45 in FIG. 4, to assert high, but only after the rising edge at clock input N_CLK 742, and thus only after the low data input signal Q 721 has been clocked through to negative runt flip-flop output 744. A subsequent transition by the input signal 10 from above to below High_Threshold 4 causes a falling edge on clock input N_CLK 742.

If a Negative Transition is not detected (i.e., the input signal 10 does not make a true low transition from above to below Low_Threshold 2), the non-inverted low threshold comparator output signal L_thr 605 will remain high, and thus, S-R flip-flop output signal Q 721 will remain asserted high. Then, when a Positive Transition occurs (i.e., the input signal 10 crosses back above High_Threshold 4 from below High_Threshold 4), a rising edge will appear on clock input N_CLK 742, causing the negative runt flip-flop 740 to latch the asserted high data input signal Q 721 such that a high Negative_Runt signal 745 appears at output 744 of the negative runt flip-flop 740, indicating that a negative runt fault has been detected.

If, however, a Positive Transition is not detected but instead the input signal 10 makes a Negative Transition from above to below Low_Threshold 2, non-inverted low threshold comparator output signal L_thr 605 will go low, causing S-R flip-flop output signal Q 721 to deassert low and output signal P 711, corresponding to the signal Full_Low_Transition 46 in FIG. 4, to assert high. The detection of the Full_Low_Transition 46 signal causes control to pass to the positive runt detection portion of the circuit.

2. Detection of Positive Runts

The operation for detecting a positive runt fault is as follows. Before the input signal 10 crosses below Low_Threshold 2, the data input signal P 711 (corresponding to the Full_Low_Transition signal 46 in FIG. 4), will be low. A full transition from above High_Threshold 4 to below Low_Threshold 2 by the input signal 10 causes a rising edge on clock input P_CLK 732 when the data input signal P 711 for positive runt flip-flop 730 is still deasserted low. This causes the positive runt flip-flop 730 to hold the Positive_Runt signal 735 low at positive runt flip-flop output 734. The full high-to-low transition by the input signal 10 also causes output signal Q 721 to deassert low and output signal P 711, corresponding to the signal Full_Low_ Transition 46 in FIG. 4, to assert high, but only after the rising edge at clock input P_CLK 732, and thus only after the low data input signal P 711 has been clocked through to positive runt flip-flop output 734. A subsequent transition by the input signal 10 from below to above Low_Threshold 2 causes a falling edge on clock input P_CLK 732.

If a Positive Transition is not detected (i.e., the input signal 10 does not transition from below to above High_Threshold 4), the inverted high threshold comparator output signal H_thr' will not assert low, and thus, S-R flip-flop output signal P 711 will remain high. Then, when a Negative Transition occurs (i.e., the input signal 10 crosses back from above to below Low_Threshold 2), a rising edge will appear on clock input P_CLK 732, causing the positive runt flip-flop 730 to latch the asserted high data input signal P 711 such that a high Positive_Runt signal 735 appears at output 734 of the positive runt flip-flop 730, indicating that a positive runt fault has been detected.

If, however, a Negative Transition is not detected but instead the input signal 10 makes a Positive Transition from below to above High_Threshold 4, inverted high threshold comparator output signal H_thr' 603 will go low, causing S-R flip-flop output signal P 711 to go low and output signal Q 721, corresponding to the signal Full_High_Transition 45 in FIG. 4, to assert high. Control then passes to the negative runt detection portion of the circuit.

3. Initial Conditions of the Input Signal

Figure 9:
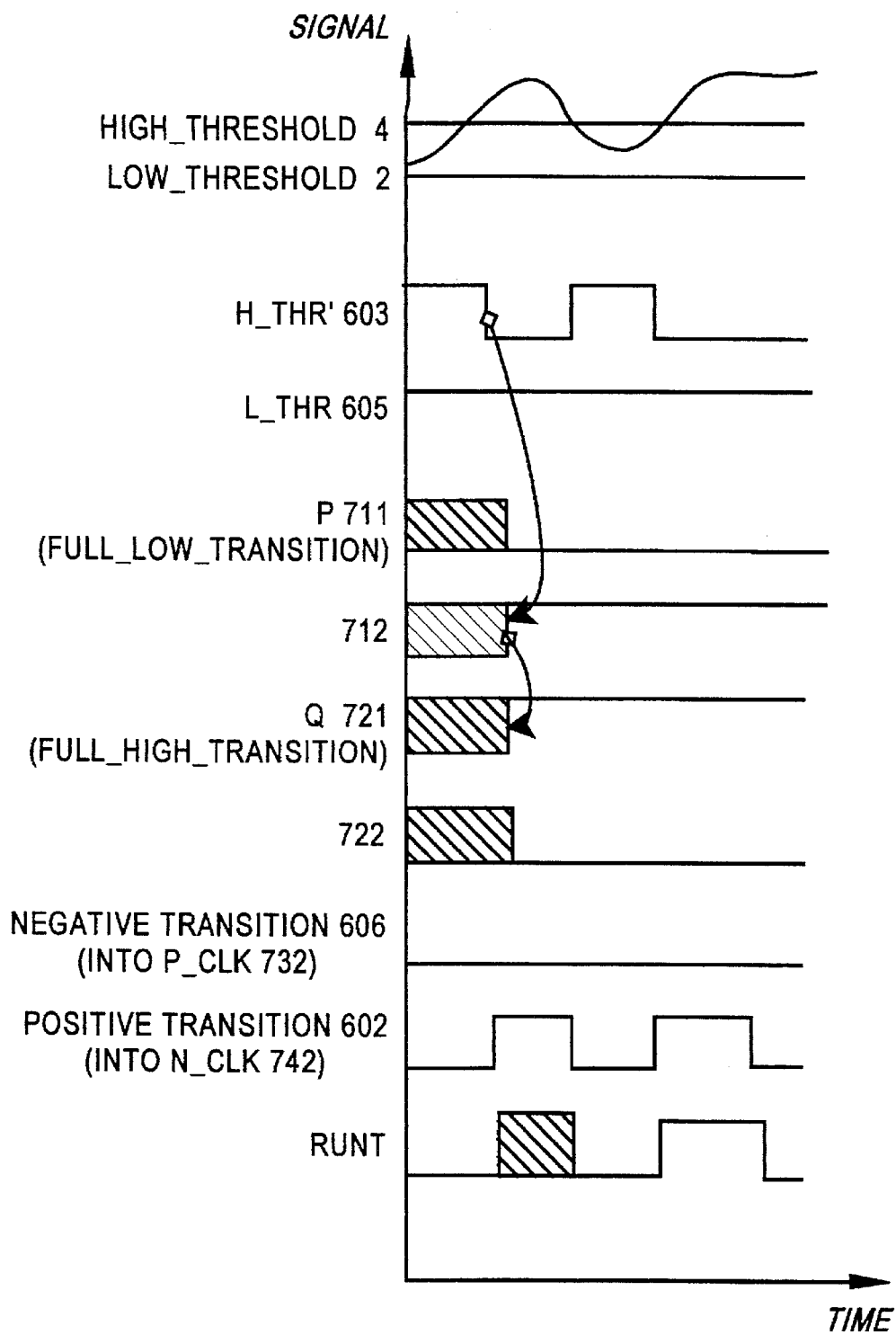
FIG. 9 is a timing diagram illustrating the operation of the preferred embodiment of the runt fault detector shown in FIG. 7 in response to an alternative input signal.

FIG. 9 is a timing diagram of the operation of the runt fault detector 700 of FIG. 7 in response to an alternative input signal which is initially floating and then makes a subsequent transition above High_Threshold 4. Before the input signal 10 crosses above High_Threshold 4, the data input signal Q 721 of negative runt flip-flop 740, corresponding to the signal Full_High_Transition 45 in FIG. 4, may be either high or low, depending on which state it resolves to during the float. A transition above High_Threshold 4 by the input signal 10 causes a rising edge on clock input N_CLK 742. If the data input signal Q 711 for negative runt flip-flop 740 is low, the negative runt flip-flop 740 will hold the Negative_Runt signal 745 low at negative runt flip-flop output 744, and thus a negative runt will not be signalled to subsequent circuitry. If, however, the Full_High_Transition signal Q 711 received at the data input 741 of the negative runt flip-flop 740 is resolved high, the rising edge on the clock input N_CLK 742 will cause a Negative_Runt signal 745 to go valid (high) at the negative runt flip-flop output 744 even though a negative runt did not really occur. This "false" Negative_Runt signal 745 which occurs on initialization may be ignored by feeding the Negative_Runt signal 745, along with an enable signal N_en 746 (which becomes valid only after initialization), through an AND gate 760, as discussed hereinafter. The transition by the input signal 10 above High_Threshold causes the flip-flop output signals P 711 and Q 721 to resolve. Specifically, the transition by the input signal 10 above High_Threshold causes Full_Low_Transition signal P 711 to deassert low and Full_High_Transition signal Q 721 to assert high, but only after the rising edge at clock input N_CLK 742, and thus only after the unresolved data input signal Q 721 has been clocked through to negative runt flip-flop output 744. A subsequent transition by the input signal 10 from above to below High_Threshold 4 causes a falling edge on clock input N_CLK 742. Operation then continues as previously described with respect to FIG. 8. Thus, since Full_High_Transition signal Q 721 is valid, the runt fault detector 700 is looking for a negative runt fault.

Thus, as shown in FIG. 9, the Full_High_Transition signal Q 721 will remain valid until a full high-to-low transition by the input signal is detected (i.e., Full_Low_Transition signal P 711 goes high). In FIG. 9, the input signal 10 crosses back above High_Threshold 4 from below High_Threshold 4 without crossing below Low_Threshold 2. Thus, the Full_High_Transition signal Q 721 remains valid when a Positive Transition occurs, causing a rising edge to appear on clock input N_CLK 742. Thus, the negative runt flip-flop 740 clocks the asserted high data input signal Q 721, causing a high Negative_Runt signal 745 to appear at the negative runt flip-flop output 744 to indicate that a negative runt fault has been detected.

Figure 10:
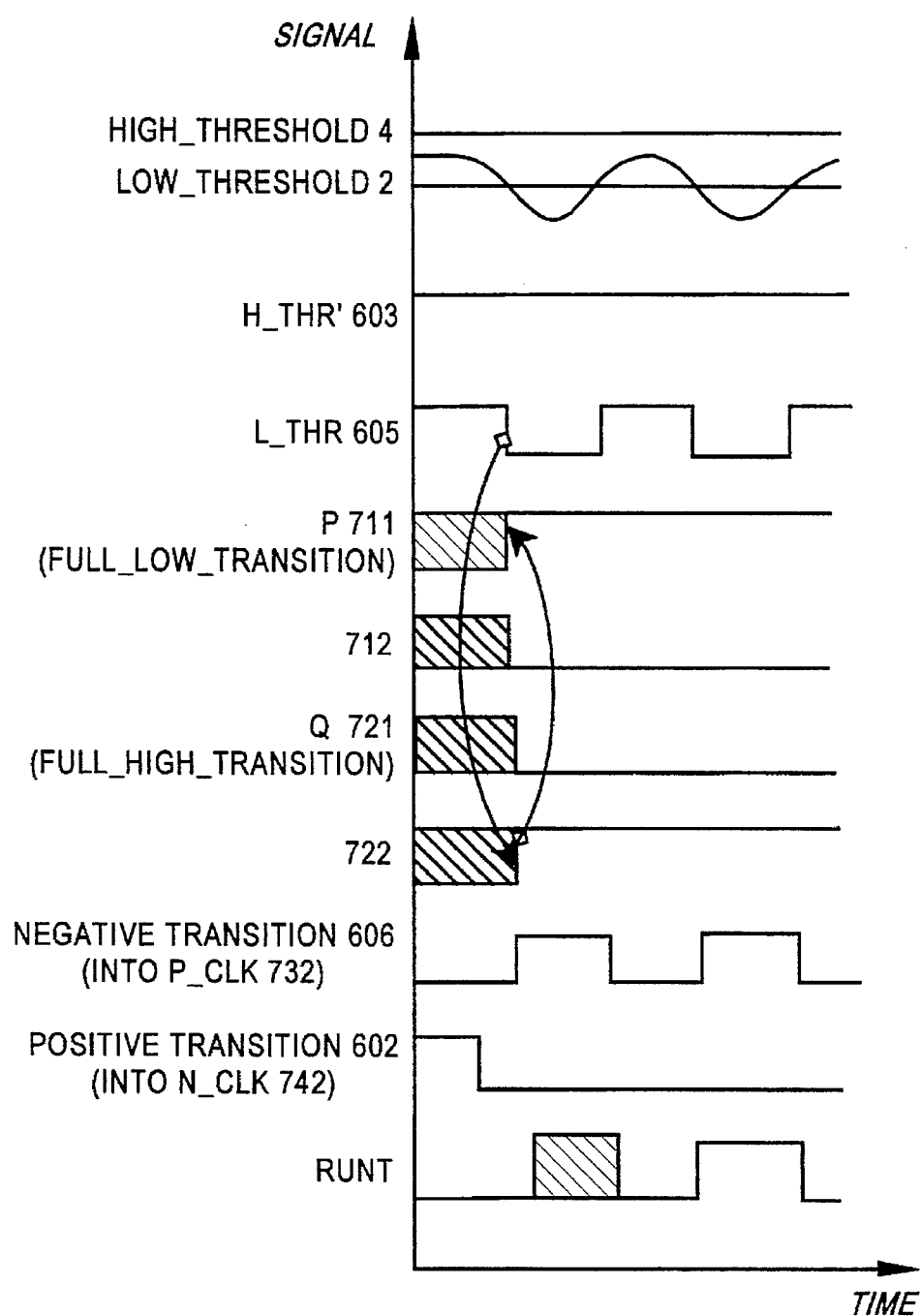
FIG. 10 is a timing diagram illustrating the operation of the preferred embodiment of the runt fault detector shown in FIG. 7 in response to another alternative input signal.

FIG. 10 is a timing diagram of the operation of the runt fault detector 700 of FIG. 7 in response to an alternative input signal which is initially floating and then makes a subsequent transition below Low_Threshold 2. Before the input signal 10 crosses below Low_Threshold 2, the data input signal P 711 of positive runt flip-flop 730, corresponding to the signal Full_Low_Transition 46 in FIG. 4, may be either high or low, depending on which state it resolves to during the float. A transition below Low_Threshold 2 by the input signal 10 causes a rising edge on clock input P_CLK 732. If the data input signal P 711 for positive runt flip-flop 730 is low, the positive runt flip-flop 730 will hold the Positive_Runt signal 735 low at positive runt flip-flop output 734, and thus a positive runt will not be signalled to subsequent circuitry. If, however, the Full_Low_Transition signal P 711 received at the data input 731 of the positive runt flip-flop 730 is resolved high, the rising edge on the clock input P_CLK 732 will cause a Positive_Runt signal 735 to go valid (high) at the positive runt flip-flop output 734 even though a positive runt did not really occur. This "false" Positive_Runt signal 735 which occurs on initialization may be ignored by feeding the Positive_Runt signal 735, along with an enable signal N_en 736 (which becomes valid only after initialization), through an AND gate 750, as discussed hereinafter. The transition by the input signal 10 below Low_Threshold 2 causes the flip-flop output signals P 711 and Q 721 to resolve. Specifically, the transition by the input signal 10 below Low_Threshold 2 causes Full_High_Transition signal Q 721 to deassert low and Full_Low_Transition signal P 711 to assert high, but only after the rising edge at clock input P_CLK 732, and thus only after the unresolved data input signal P 711 has been clocked through to positive runt flip-flop output 734. A subsequent transition by the input signal 10 from below to above Low_Threshold 2 causes a falling edge on clock input P_CLK 732. Operation then continues as previously described with respect to FIG. 8. Thus, since Full_Low_Transition signal P 711 is valid, the runt fault detector 700 is looking for a positive runt fault.

Thus, as shown in FIG. 10, the Full_Low_Transition signal P 711 will remain valid until a full low-to-high transition by the input signal is detected (i.e., Full_High_Transition signal Q 721 goes high). In FIG. 10, the input signal 10 crosses back below Low_Threshold 2 from above Low_Threshold 2 without crossing above High_Threshold 4. Thus, the Full_Low_Transition signal P 711 remains valid when a Negative Transition occurs, causing a rising edge to appear on clock input P_CLK 732. Thus, the positive runt flip-flop 730 clocks the asserted high data input signal P 711, causing a high Positive_Runt signal 735 to appear at the positive runt flip-flop output 734 to indicate that a positive runt fault has been detected.

4. Runt Fault Communication

As also shown in the preferred embodiment of the runt fault detector 700 in FIG. 7, a pair of enable gates, positive runt enable gate 750 and negative enable gate 760, are provided to allow communication of either or both "positive" and "negative" runt signals to be masked. The positive runt enable gate 750 receives the Positive_Runt signal 735 from the positive runt flip-flop 730 along with a positive runt enable signal P_en 736. If the positive runt enable signal P_en 736 is valid (high), communication of detection of "positive" runt faults is allowed; if the positive runt enable signal P_en 736 is invalid (low), communication is not allowed. Likewise, the negative runt enable gate 760 receives the Negative_Runt signal 745 from the negative runt flip-flop 740 along with a negative runt enable signal N_en 746. If the negative runt enable signal N_en 746 is valid (high), communication of detection of "negative" runt faults is allowed; if the negative runt enable signal N_en 746 is invalid (low), communication is not allowed. Thus, positive and negative runt enable gates 750 and 760 effectively act as switches to mask communication of runt faults that are detected.

In order to provide simultaneous detection of both "positive" and "negative" runt pulses, the Positive_Runt signal 735 and the Negative_Runt signal 745 in the preferred embodiment are ORed together by OR gate 770, after respectively passing through the optional positive and negative runt enable gates 750 and 760.

5. Multiple Runt Fault Detection

Another optional enhancement to preferred embodiment of the runt fault detector 700 shown in FIG. 7 is the addition of positive and negative feedback buffers 752 and 762 connected between either the respective positive and negative runt flip-flop outputs 734, 744, the AND gate outputs 751, 761, or the output 775 of the OR gate 770, and the respective flip-flop reset inputs 733, 743 of positive and negative runt flip-flops 730, 740. The feedback feature operates to allow continuous signalling of positive or negative runt faults as they are detected by resetting the positive and negative runt flip-flops 730, 740 after a detected runt fault has been communicated.

Figure 11:
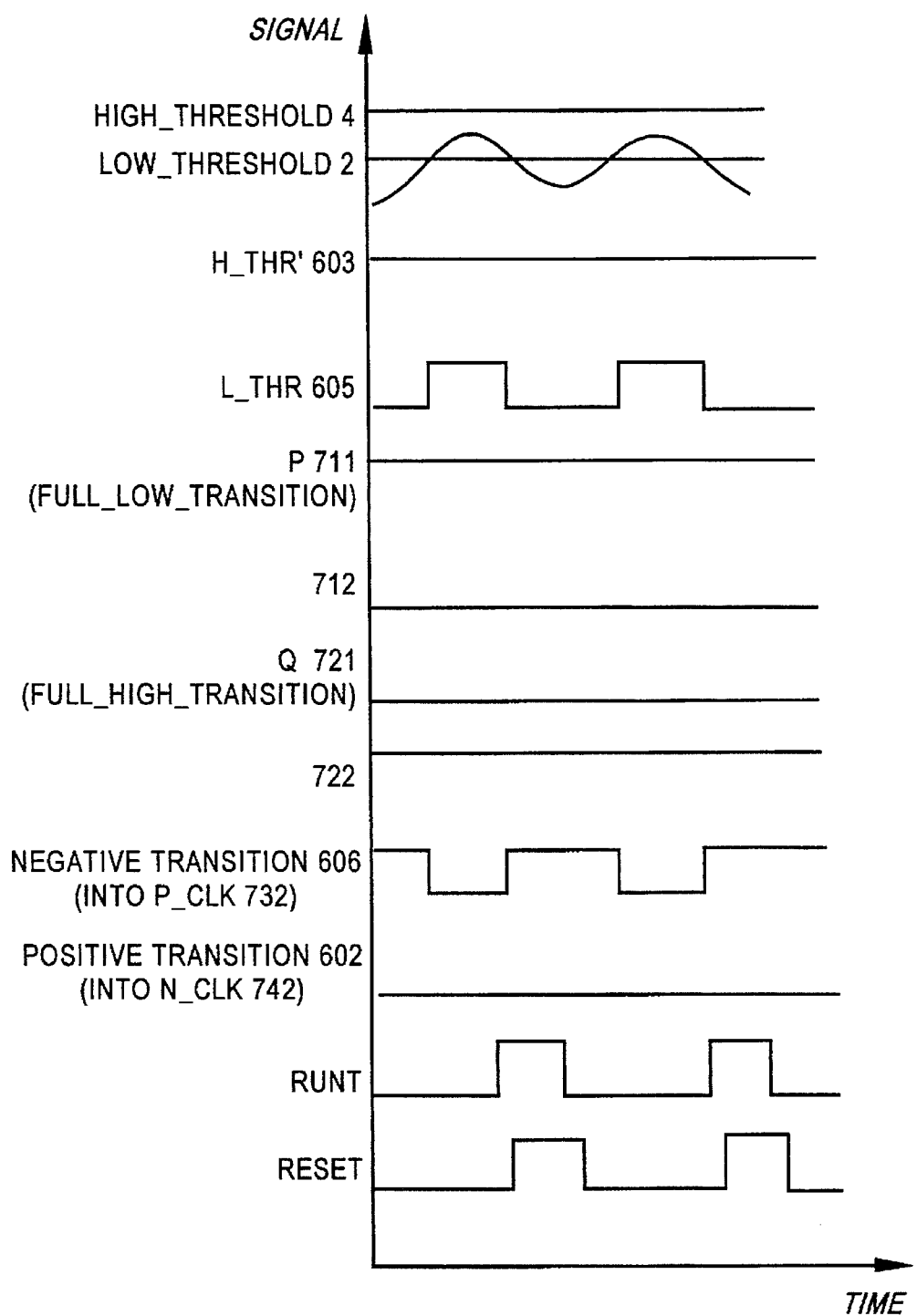
FIG. 11 is a timing diagram illustrating the operation of the preferred embodiment of the runt fault detector shown in FIG. 7 in the detection of multiple runt faults.

FIG. 11 shows a timing diagram of the operation of the runt fault detector 700 of FIG. 7 in response to an input signal with multiple positive runts. As shown in FIG. 11, when the input signal 10 is below Low_Threshold 2, both the data input Full_Low_Transition signal P 711 of positive runt flip-flop 730 and the Negative_Transition P_CLK signal are high. A subsequent transition by the input signal above Low_Threshold causes the Negative_Transition P_CLK signal to fall. Since Full_Low_Transition signal P 711 is valid, the runt fault detector 700 is looking for a positive runt fault. The detection of a rising edge on P_CLK 732 (Negative_Transition signal 606), caused by the transition below Low_Threshold 2 by the input signal without first crossing above High_Threshold 4, indicates that a positive runt fault has occurred, and the Positive_Runt signal 735 accordingly goes valid (high) with the rising edge or P_CLK. The positive feedback buffer 752 connected between either the positive runt flip-flop output 734, the output of AND gate 750, or the output of the OR gate 770, and the positive runt flip-flop reset input 733 allows the Positive_Runt signal 735 to be reset (low) immediately after signaling the detection of a positive runt, as shown in FIG. 11. Then, a subsequent transition by the input signal above Low_Threshold will cause a falling edge on P_CLK. The Full_Low_Transition signal P 711 remains valid until a full low-to-high transition (indicated by a valid Full_High_Transition) is detected. Thus, a subsequent transition back below Low_Threshold 2 causes another rising edge on P_CLK 732 and results in another valid (high) Positive_Runt signal 735. Operation continues in this manner, detecting multiple positive runts as they occur, until a valid (high) Full_High_Transition signal Q 721 causes the Full_Low_Transition signal P 711 to go invalid (low). Then the runt fault detector 700 begins looking for negative runts until a Full_Low_Transition signal P 711 becomes valid again. Multiple negative runts are detected in like manner.

b. A Second Embodiment

Figure 12:
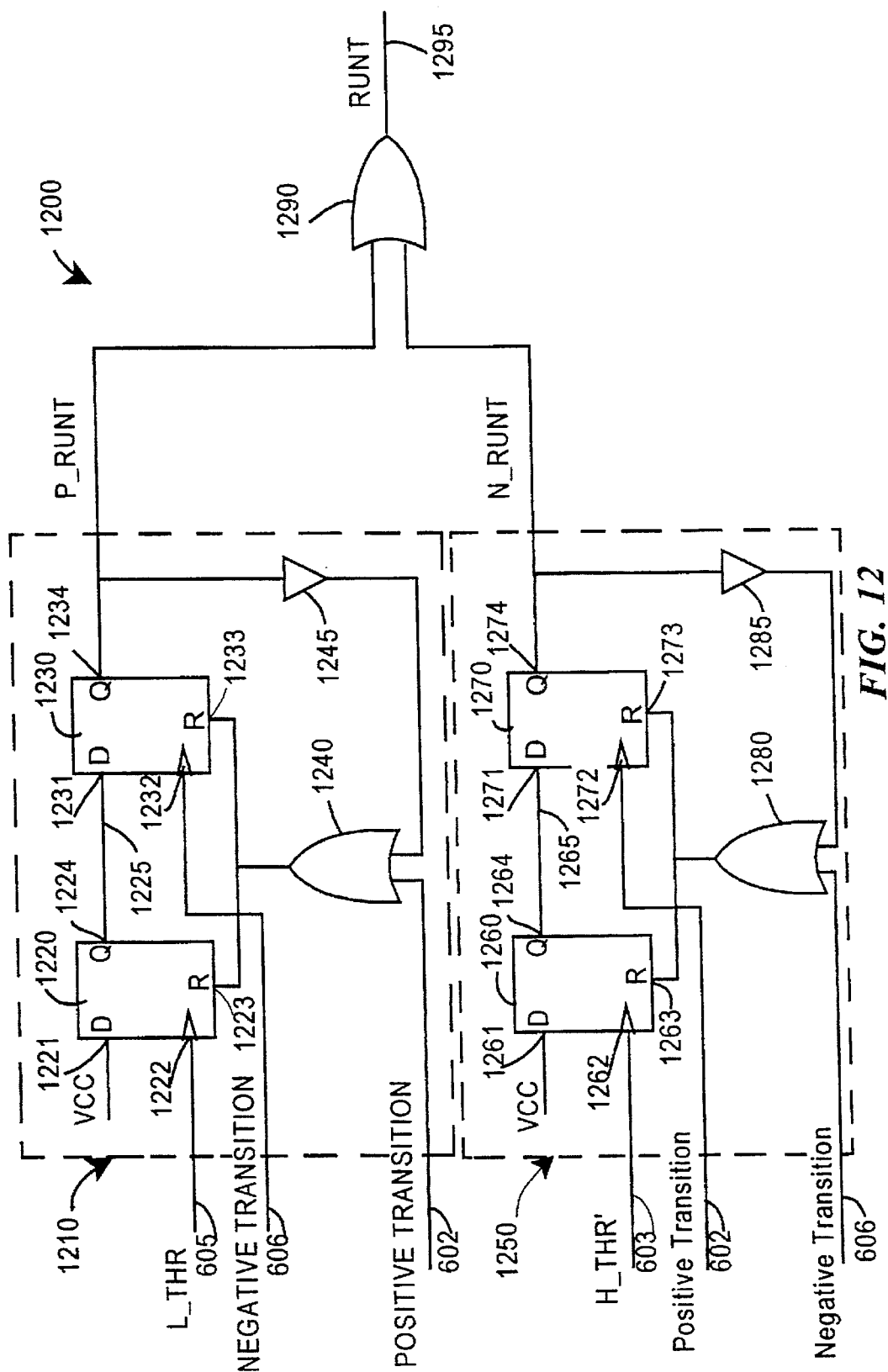
FIG. 12 is a schematic diagram illustrating an alternative preferred embodiment of the runt fault detector of the present invention.

An alternative embodiment of a runt fault detector in accordance with the present invention is shown generally at 1200 in FIG. 12. As shown in FIG. 12, the runt fault detector 1200 includes a positive runt detector circuit 1210 and/or a negative runt detector circuit 1250.

The negative runt detector circuit 1250 includes a first flip-flop 1260 which has a data input 1261 coupled to a voltage supply (i.e., tied high), a clock input 1262 coupled to receive the H_thr' signal 603 derived by the threshold comparator in FIG. 6, a reset input 1263, and an output 1264. The negative runt detector circuit 1250 also includes a second flip-flop 1270 which has a data input 1271 coupled to the output 1264 of the first flip-flop 1260, a clock input 1272 coupled to receive the inverted version of the H_thr' signal 603 (i.e., the Positive Transition signal 602), a reset input 1273, and an output 1274 on which a negative runt signal N_RUNT is produced. The respective reset inputs 1263, 1273 of the first and second flip-flops 1260, 1270 are each coupled to the Negative Transition signal 606 derived by the threshold comparator of FIG. 6.

An optional enhancement to the negative runt detector circuit 1250 is the addition of a feedback buffer 1285 coupled between the output 1274 of the second flip-flop 1270 and one input of an OR gate 1280. The OR gate 1280 is also coupled to receive Negative Transition signal 606 as a second input, and its output is coupled to each of the respective reset inputs 1263, 1273 of the first and second flip-flops 1260, 1270. The feedback buffer 1285 and OR gate 1280 cause the negative runt detector circuit 1250 to be reset after the negative runt fault has been communicated. This feature, as described below with respect to the positive runt fault circuit 1210, allows for continuous detection of negative runt faults without having to wait to be reset.

The positive runt detector circuit 1210 includes a first flip-flop 1220 which has a data input 1221 coupled to a voltage supply (i.e., tied high), a clock input 1222 coupled to receive the L_thr signal 605 derived by the threshold comparator in FIG. 6, a reset input 1223, and an output 1224. The positive runt detector circuit 1210 also includes a second flip-flop 1230 which has a data input 1231 coupled to the output 1224 of the first flip-flop 1220, a clock input 1232 coupled to receive the inverted version of the L_thr signal 605 (i.e., the Negative Transition signal 606), a reset input 1233, and an output 1234 on which a positive runt signal P_RUNT is produced. The respective reset inputs 1223, 1233 of the first and second flip-flops 1220, 1230 are each coupled to the Positive Transition signal 602 derived by the threshold comparator of FIG. 6.

An optional enhancement to the positive runt detector circuit 1210 is the addition of a feedback buffer 1245 coupled between the output 1234 of the second flip-flop 1230 and one input of an OR gate 1240. The OR gate 1240 is also coupled to receive Positive Transition signal 602 as a second input, and its output is coupled to each of the respective reset inputs 1223, 1233 of the first and second flip-flops 1220, 1230. The feedback buffer 1245 and OR gate 1240 cause the positive runt detector circuit 1210 to be reset after the positive runt fault has been communicated. This feature allows for continuous detection of positive runt faults without having to wait to be reset. (When the circuit must wait to be reset, positive runt pulses that occur between the time the first positive runt pulse is detected and the time the circuit is reset will not be detected.)

Figure 13:
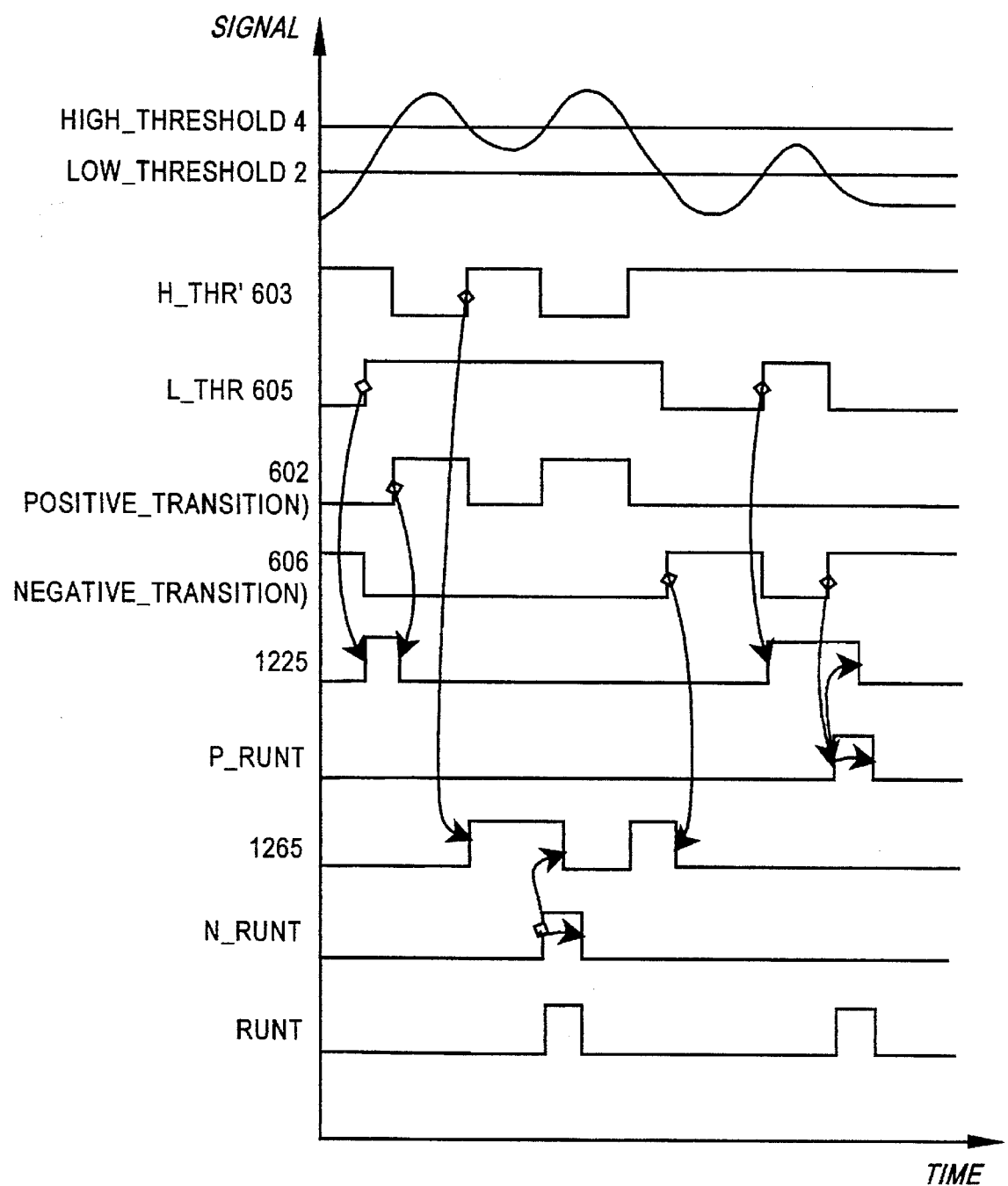
FIG. 13 is a timing diagram illustrating the operation of the preferred embodiment of the runt fault detector shown in FIG. 12.

FIG. 13 shows a timing diagram illustrating the operation of the runt fault detector 1200 shown in FIG. 12. As shown in FIG. 12, with reference to FIG. 13, the Full Transition Detector 520 of FIG. 5 is implemented in the respective positive and negative runt detector circuits 1210, 1250 by respective first flip-flops 1220, 1260, and the Runt Fault Detector 530 of FIG. 5 is implemented in the respective positive and negative runt detector circuits 1210, 1250 by respective second flip-flops 1230, 1270.

1. Negative Runt Detection

As shown in FIGS. 12 and 13, negative runt faults are detected as follows. Assuming initially that the input signal is below Low_Threshold 2, the Negative Transition signal 606 will be high, causing the first flip-flop 1260 of negative runt detector circuit 1250 to be reset. This results in a low signal at first flip-flop output 1264 (hereinafter Full_High_Transition signal 1265).

When the input signal transitions above Low_Threshold 2, Negative Transition signal 606 will go low, releasing the reset of the first flip-flop 1260. Thus, first flip-flop 1260 will clock the data input 1261 on the next rising edge of the clock input signal H_thr' 603. The next rising edge of the clock input signal H_thr' 603 will only occur if the input signal crosses below High_Threshold 4. (Note also that if the input signal starts up initially above High_Threshold 4 or initially floating followed by a transition above High_Threshold 4, the first flip-flop 1260 will not be reset because the Negative Transition signal will be low. However, the clock input signal H_thr' 603 will also be initially high, so the Full_High_Transition signal 1265 will only go high on a subsequent rising edge of clock input signal H_thr' 603.) Thus, as shown in FIG. 13, the Full_High_Transition signal 1265 in the embodiment of FIG. 12 refers the condition that either: (1) the input signal is initially above High_Threshold 4 and then has crossed below High_Threshold 4, (2) the input signal is initially floating, and then has crossed above and then below High_Threshold 4, or (3) the input signal has fully transitioned from below Low_Threshold 2 to above High_Threshold 4, and then back below High_Threshold 4.

When the Full_High_Transition signal 1265 goes high, a negative runt fault will be detected if a subsequent Positive Transition signal is detected before the Full_High_Transition signal 1265 goes low. Thus, as shown in FIG. 12, the Fault Detection Unit 530 of FIG. 5 is implemented in the negative runt detector circuit 1250 with the second flip-flop 1270. The data input 1271 of second flip-flop 1270 receives the Full_High_Transition signal 1265. A negative runt fault signal N_RUNT is detected when the Full_High_Transition signal 1265 is high at the time of a rising edge on the Positive Transition signal 602.

2. Positive Runt Detection

As also shown in FIGS. 12 and 13, positive runt faults are detected as follows. Assuming initially that the input signal is above High_Threshold 4, the Positive Transition signal 602 will be high, causing the first flip-flop 1220 of positive runt detector circuit 1210 to be reset. This results in a low signal at first flip-flop output 1224 (hereinafter Full_Low_Transition signal 1225).

When the input signal transitions below High_Threshold 4, Positive Transition signal 602 will go low, releasing the reset of the first flip-flop 1220. Thus, first flip-flop 1220 will clock the data input 1221 on the next rising edge of the clock input signal L_thr 605. The next rising edge of the clock input signal L_thr 605 will only occur if the input signal crosses above Low_Threshold 2. (Note also that if the input signal starts up initially below Low_Threshold 2 or initially floating followed by a transition below Low_Threshold 2, the first flip-flop 1220 will not be reset because the Positive_Transition signal 602 will be low. However, the clock input signal L_thr 605 will also initially be high, so the Full_Low_Transition signal 1225 will only go high on a subsequent rising edge of clock input signal L_thr 605.) Thus, as shown in FIG. 13, the Full_Low_Transition signal 1225 in the embodiment of FIG. 12 refers the condition that either: (1) the input signal is initially below Low_Threshold 2 and then has crossed above Low_Threshold 2, (2) the input signal is initially floating and then has crossed below and then back above Low_Threshold, or (3) the input signal has fully transitioned from above High_Threshold 4 to below Low_Threshold 2, and then back above Low_Threshold 2.

When the Full_Low_Transition signal 1225 goes high, a positive runt fault will be detected if a subsequent Negative Transition signal is detected before the Full_Low_Transition signal 1225 goes low. Thus, as shown in FIG. 12, the Fault Detection Unit 530 of FIG. 5 is implemented in the positive runt detector circuit 1210 with the second flip-flop 1230. The data input 1231 of second flip-flop 1230 receives the Full_Low_Transition signal 1225. A positive runt fault signal P_RUNT is detected when the Full_Low_Transition signal 1225 is high at the time of a rising edge on the Negative Transition signal 606.

As shown in the timing diagram in FIG. 13, the respective feedback buffers 1245 and 1285 operate to reset the respective positive runt detector circuit 1210 and negative runt detector circuit 1250 after a respective positive or negative runt fault has been detected. This allows for continuous monitoring of positive and negative runt faults.

Based upon the foregoing detailed description, the present invention provides an efficient runt fault detector for simultaneously detecting positive and negative runt pulses on an input signal based only upon detection of high and low threshold crossings by the input signal.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A runt fault detector comprising:
   a threshold comparator responsive to an input signal, a first voltage threshold and a second voltage threshold, which produces a first transition signal when the input signal transitions across the first voltage threshold in a first direction away from the second voltage threshold, and a second transition signal when the input signal transitions across the second voltage threshold in a second direction opposite the first direction;
   a full transition detector responsive to the first transition signal and the second transition signal which produces a first full-transition signal upon detection of a full transition by the input signal across the second voltage threshold and then the first voltage threshold in sequence in the first direction; and
   a runt detector responsive to the first full-transition signal and the first transition signal to generate a runt fault upon detection in sequence of the first full-transition signal and then the first transition signal without an intervening detection of the second transition signal.

2. The detector of claim 1, the threshold comparator comprising:

a first threshold comparator, connected to receive the input signal and the first voltage threshold, for producing the first transition signal when the input signal transitions across the first voltage threshold in the first direction; and a second threshold comparator, connected to receive the input signal and the second voltage threshold, for producing the second transition signal when the input signal transitions across the second voltage threshold in the second direction.

3. The detector of claim 1, the full transition detector further comprising an S-R flip-flop having a set input for receiving the first transition signal, a reset input for receiving the second transition signal, and a first S-R flip-flop output to produce the first full-transition signal.

4. The detector of claim 1, the full transition detector further comprising a first D-type flip-flop having a first data input connected to a supply voltage, a first clock input connected to receive the first transition signal, a reset input connected to receive the second transition signal, and a first flip-flop output to produce the first full-transition signal.

5. The detector of claim 1, the runt detector comprising a first D-type flip-flop, connected to receive the first full-transition signal at a first data input and the first transition signal at a first clock input, for producing a first runt fault signal upon detection in sequence of the first full-transition signal and then the first transition signal without an intervening second transition signal.

6. The detector of claim 1, the threshold comparator comprising:

a first threshold comparator, connected to receive the input signal and the first voltage threshold, for producing the first transition signal when the input signal transitions across the first voltage threshold in the first direction; and a second threshold comparator, connected to receive the input signal and the second voltage threshold, for producing the second transition signal when the input signal transitions across the second voltage threshold in the second direction;

the full transition detector comprising an S-R flip-flop having a set input for receiving the first transition signal, a reset input for receiving the second transition signal, and a first S-R flip-flop output to produce the first full-transition signal; and the runt detector comprising a first D-type flip-flop, connected to receive the first full-transition signal at a first data input and the first transition signal at a first clock input, for producing a first runt fault signal upon detection in sequence of the first full-transition signal and then the first transition signal without an intervening second transition signal.

7. The detector of claim 1, the threshold comparator comprising:

a first threshold comparator, connected to receive the input signal and the first voltage threshold, for producing the first transition signal when the input signal transitions across the first voltage threshold in the first direction; and a second threshold comparator, connected to receive the input signal and the second voltage threshold, for producing the second transition signal when the input signal transitions across the second voltage threshold in the second direction;

the full transition detector comprising a first D-type flip-flop having a first data input connected to a supply voltage, a clock input connected to receive the first transition signal, a reset input connected to receive the second transition signal, and a first flip-flop output to produce the first full-transition signal; and the runt detector comprising a first D-type flip-flop, connected to receive the first full-transition signal at a first data input and the first transition signal at a first clock input, for producing a first runt fault signal upon detection in sequence of the first full-transition signal and then the first transition signal without an intervening second transition signal.

8. The detector of claim 1, the full transition detector further producing a second full-transition signal upon detection of a full transition by the input signal across the first voltage threshold and then the second voltage threshold in sequence in the second direction, and wherein the runt detector is also responsive to the second full-transition signal and the second transition signal to generate a runt fault upon detection in sequence of the second full-transition signal and then the second transition signal without an intervening detection of the first transition signal.

9. The detector of claim 8, the threshold comparator comprising:

a first threshold comparator, connected to receive the input signal and the first voltage threshold, for producing the first transition signal when the input signal transitions across the first voltage threshold in the first direction; and a second threshold comparator, connected to receive the input signal and the second voltage threshold, for producing the second transition signal when the input signal transitions across the second voltage threshold in the second direction.

10. The detector of claim 8, the full transition detector further comprising a second D-type flip-flop having a second data input connected to a supply voltage, a second clock input connected to receive the second transition signal, a second reset input connected to receive the first transition signal, and a second flip-flop output to produce the second full-transition signal.

11. The detector of claim 8, the runt detector comprising:

a first runt D-type flip-flop, connected to receive the first full-transition signal at a first runt data input and the first transition signal at a first runt clock input, for producing a first runt fault signal upon detection in sequence of the first full-transition signal and then the first transition signal without an intervening second transition signal; and a second runt D-type flip-flop, connected to receive the second full-transition signal at a second runt data input and the second transition signal at a second runt clock input, for producing a second runt fault signal upon detection in sequence of the second full-transition signal and then the second transition signal without an intervening first transition signal.

12. The detector of claim 8, further comprising a signal combiner for generating a runt fault signal upon detection of either or both of the first runt fault signal or the second runt fault signal.

13. The detector of claim 12, wherein the signal combiner comprises an OR gate.

14. The detector of claim 8, the threshold comparator comprising:

a first threshold comparator, connected to receive the input signal and the first voltage threshold, for producing the first transition signal when the input signal transitions across the first voltage threshold in the first direction; and a second threshold comparator, connected to receive the input signal and the second voltage threshold, for producing the second transition signal when the input signal transitions across the second voltage threshold in the second direction;

the full transition detector comprising an S-R flip-flop having a set input for receiving the first transition signal, a reset input for receiving the second transition signal, a first S-R flip-flop output to produce the first full-transition signal, and a second S-R flip-flop output to produce the second full-transition signal;

and the runt detector comprising a first D-type flip-flop, connected to receive the first full-transition signal at a first data input and the first transition signal at a first clock input, for producing a first runt fault signal upon detection in sequence of the first full-transition signal and then the first transition signal without an intervening second transition signal; and a second D-type flip-flop, connected to receive the second full-transition signal at a second data input and the second transition signal at a second clock input, for producing a second runt fault signal upon detection in sequence of the second full-transition signal and then the second transition signal without an intervening first transition signal.

15. The detector of claim 8, the threshold comparator comprising:

a first threshold comparator, connected to receive the input signal and the first voltage threshold, for producing the first transition signal when the input signal transitions across the first voltage threshold in the first direction; and a second threshold comparator, connected to receive the input signal and the second voltage threshold, for producing the second transition signal when the input signal transitions across the second voltage threshold in the second direction;

the full transition detector comprising:

a first D-type flip-flop having a first data input connected to a supply voltage, a first clock input connected to receive the first transition signal, a reset input connected to receive the second transition signal, and a first flip-flop output to produce the first full-transition signal; and a second D-type flip-flop having a second data input connected to a supply voltage, a second clock input connected to receive the second transition signal, a second reset input connected to receive the first transition signal, and a second flip-flop output to produce the second full-transition signal; and the runt detector comprising a first runt flip-flop, connected to receive the first full-transition signal at a first runt data input and the first transition signal at a first runt clock input, for producing a first runt fault signal upon detection in sequence of the first full-transition signal and then the first transition signal without an intervening second transition signal; and a second runt flip-flop, connected to receive the second full-transition signal at a second runt data input and the second transition signal at a second runt clock input, for producing a second runt fault signal upon detection in sequence of the second full-transition signal and then the second transition signal without an intervening first transition signal.

16. A method for detecting a runt fault on an input signal based solely upon transitions by the input signal across a first voltage threshold and across a second voltage threshold, comprising the steps of:

(a) monitoring the input signal to produce a first full-transition signal upon detection in sequence of a transition by the input signal across the second voltage threshold in a first direction towards the first voltage threshold and then across the first voltage threshold in the first direction;

(b) monitoring the input signal to produce:

(i) a first transition signal upon detection of a transition by the input signal across the first voltage threshold in the first direction, and (ii) to produce a second transition signal upon detection of a transition by the input signal across the second voltage threshold in a second direction opposite from the first direction; and (c) monitoring the first full-transition signal and the first transition signal to produce a runt fault upon detection in sequence of the first full-transition signal and then the first transition signal without an intervening detection of the second transition signal.

17. The method of claim 16, further comprising the simultaneous steps of;

(d) monitoring the input signal to produce a second full-transition signal upon detection of a full transition by the input signal across the first voltage threshold and then the second voltage threshold in sequence in the second direction;

(e) monitoring the input signal to produce:

(i) a first transition signal upon detection of a transition by the input signal across the first voltage threshold in the first direction, and (ii) to produce a second transition signal upon detection of a transition by the input signal across the second voltage threshold in the second direction; and (f) monitoring the second full-transition signal and the second transition signal to produce a runt fault upon detection in sequence of the second full-transition signal and then the second transition signal without an intervening detection of the first transition signal.

18. A method for detecting a runt fault on an input signal based solely upon transitions by the input signal across a first voltage threshold and across a second voltage threshold, comprising the steps of:

(a) monitoring the input signal to produce a first full-transition signal upon detection in sequence of a transition by the input signal across the second voltage threshold in a first direction towards the first voltage threshold and then across the first voltage threshold in the first direction, and then across the first voltage threshold in a second direction opposite the first direction;

(b) monitoring the input signal:

(i) to produce a first transition signal upon detection of a transition by the input signal across the first voltage threshold in the first direction, and (ii) to produce a second transition signal upon detection of a transition by the input signal across the second voltage threshold in the second direction; and (c) monitoring the first full-transition signal and the first transition signal to produce a runt fault upon detection in sequence of the first full-transition signal and then the first transition signal without an intervening detection of the second transition signal.

19. The method of claim 18, further comprising the simultaneous steps of:

(d) monitoring the input signal to produce a second full-transition signal upon detection in sequence of a full transition by the input signal in the second direction across the first voltage threshold and then across the second voltage threshold, and then across the second voltage threshold in the first direction;

(e) monitoring the input signal:

(i) to produce a first transition signal upon detection in sequence of a transition by the input signal across the first voltage threshold in the first direction, and (ii) to produce a second transition signal upon detection in sequence of a transition by the input signal across the second voltage threshold in the second direction; and (f) monitoring the second full-transition signal and the second transition signal to produce a runt fault upon detection in sequence of the second full-transition signal and then the second transition signal without an intervening detection of the first transition signal.

* * * * *